United States Patent
Chen et al.

(10) Patent No.: US 12,368,129 B2
(45) Date of Patent: Jul. 22, 2025

(54) TEMPERATURE CONTROLLABLE BONDER EQUIPMENT FOR SUBSTRATE BONDING

(71) Applicant: Taiwan Semiconductor Manufacturing Co., Ltd., Hsinchu (TW)

(72) Inventors: Han-De Chen, Hsinchu (TW); Yun-Chen Teng, Hsinchu (TW); Chen-Fong Tsai, Hsinchu (TW); Jyh-Cherng Sheu, Hsinchu (TW); Huicheng Chang, Hsinchu (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 997 days.

(21) Appl. No.: 17/461,672

(22) Filed: Aug. 30, 2021

(65) Prior Publication Data
US 2023/0067088 A1 Mar. 2, 2023

(51) Int. Cl.
| G03F 7/20 | (2006.01) |
| B23K 1/00 | (2006.01) |
| B81C 1/00 | (2006.01) |
| H01L 21/02 | (2006.01) |
| H01L 21/66 | (2006.01) |
| H01L 21/67 | (2006.01) |
| H01L 23/00 | (2006.01) |

(52) U.S. Cl.
CPC .......... *H01L 24/741* (2013.01); *B23K 1/0016* (2013.01); *B81C 1/00261* (2013.01); *H01L 21/02041* (2013.01); *H01L 21/67011* (2013.01); *H01L 21/67248* (2013.01); *H01L 22/12* (2013.01)

(58) Field of Classification Search
CPC ............ H01L 24/741; H01L 21/02041; H01L 21/67011; H01L 21/67248; H01L 22/12; H01L 21/67109; H01L 24/75; H01L 21/67121; B81C 1/00261
See application file for complete search history.

(56) References Cited

U.S. PATENT DOCUMENTS

| 2005/0146694 A1 | 7/2005 | Tokita |
| 2009/0256581 A1 | 10/2009 | Lu et al. |
| 2010/0197051 A1 | 8/2010 | Schlezinger et al. |
| 2011/0014774 A1 | 1/2011 | Johnson et al. |
| 2013/0327463 A1* | 12/2013 | Kitahara ............. H01L 21/2007 156/64 |
| 2015/0140689 A1* | 5/2015 | Endo ................. H01L 21/67109 156/583.1 |

FOREIGN PATENT DOCUMENTS

WO   WO 2010135321 A2   11/2010

* cited by examiner

*Primary Examiner* — Mesfin T Asfaw
(74) *Attorney, Agent, or Firm* — Seed IP Law Group LLP

(57) ABSTRACT

The present disclosure provides a substrate bonding apparatus capable of temperature monitoring and temperature control. The substrate bonding apparatus comprises a fluid cooling module and a sensor module for detecting temperatures at multiple zones (e.g., two or more zones) within a substrate. The substrate bonding apparatus according to the present disclosure achieves temperature stabilization within the substrate. The substrate bonding apparatus further improves bonding process performance by reducing distortion residual, reducing bubbles on edges of the substrate, and reducing non-bonded area within the substrate.

20 Claims, 7 Drawing Sheets

TEMPERATURE CONTROLLABLE BONDER EQUIPMENT FOR SUBSTRATE BONDING

BACKGROUND

The technical field of the present disclosure pertains to substrate bonding. In the Micro-Electro-Mechanical Systems (MEMS) and micro-electronic fields, for example, there is frequently a need for bonding substrates together for the purpose of encapsulating structures in vacuum cavities or in cavities with a controlled atmosphere. Direct bonding, or fusion bonding, is used as a substrate bonding process without any additional intermediate layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
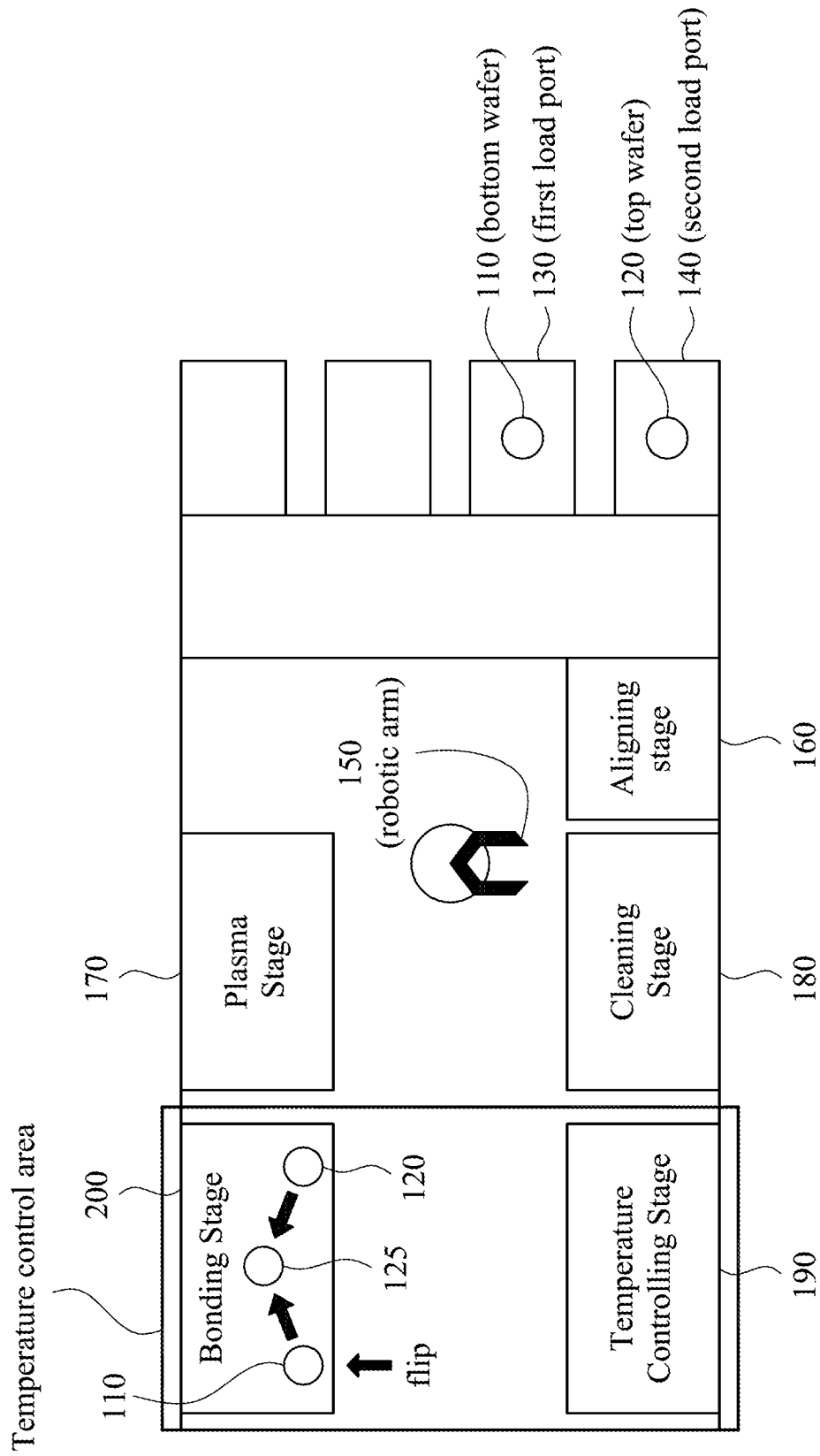
FIG. 1 illustrates a schematic diagram illustrating modules of a substrate processing apparatus for use in a substrate bonding process according to one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly defined herein.

Reference will now be made in detail to the present embodiments of the disclosure, examples of which are illustrated in the accompanying drawings. Wherever possible, the same reference numbers are used in the drawings and the description to refer to the same or like parts.

Fusion bonding (also known as direct bonding) is a process for joining surfaces without intermediate layers. The process includes formation of chemical bonds between the surfaces when the surfaces are sufficiently flat, clean, and smooth. Fusion bonding has many applications in the semiconductor manufacturing industry, e.g., to package MEMS (Micro-Electro-Mechanical Systems) devices, such as accelerometers, pressure sensors, and gyroscopes, or to manufacture semiconductor substrates, such as silicon-on-insulator (SOI) substrates. It enables the formation of non-standard material stacks that are becoming increasingly important for various high performance microelectronic device applications. As the semiconductor industry faces fundamental challenges in device scaling, there is more impetus to explore alternative materials and device structures, and the flexibility afforded by substrate bonding can potentially affect several promising new technologies. For instance, three-dimensional (3D) integrated circuits (ICs) formed by substrate bonding will allow system designers greater possibilities for optimizing circuit performance and increasing circuit functionality. Stacking different semiconductors (e.g., GaAs and Si) by substrate bonding facilitates the monolithic integration of optical and electronic devices. Alternative substrates such as silicon-on-sapphire, which have high defect densities when formed by conventional heteroepitaxy, can be realized with much lower defect densities by substrate bonding and result in improved RF circuit performance. Fabrication of novel device structures such as double-gate metal-oxide-semiconductor transistors with improved performance and scalability can be aided by substrate bonding as well.

It is noted that for fusion bonding between dielectric layers, the surfaces are subject to a roughness requirement. A low roughness is helpful for silicon fusion bonding. Fusion bonding of silicon or silicon dioxide requires that both surfaces be highly polished and smooth. According to surface roughness requirements for fusion bonding, the root mean square (RMS) surface roughness value needs to be reduced to less than 1 nanometer (nm), typically less than size of two water molecules. In some embodiments, for general hydrophilic silicon surface, the RMS surface roughness is less than about 0.552 nm.

FIG. 1 illustrates a schematic diagram of a substrate processing apparatus useful in a substrate bonding process according to one or more embodiments of the present disclosure. In FIG. 1, the sequence of obtaining a bottom substrate 110 and a top substrate 120 (e.g., silicon wafer), processing the surface of the bottom substrate 110 and the top substrate 120, and bonding the bottom substrate 110 and the top substrate 120 to each other using a substrate processing apparatus/system is illustrated.

The bottom substrate 110 is carried from a FOUP (Front Opening Unified/Universal Pod) and loaded into a first load port 130. Similarly, the top substrate 120 is carried from a FOUP and loaded into a second load port 140. A robotic arm 150 configured to carry and transfer the substrates between stages picks the bottom substrate 110 from the first load port 130 and places the substrate 110 in an aligning stage 160 and also picks the top substrate 120 from the second load port 140 and places the substrate 120 in the aligning stage 160. The alignment in the aligning stage 160 is a rough alignment and the detailed/fine alignment (e.g., in the order of micrometers or less) that occurs before the bonding process will be explained later on in conjunction with the steps in a bonding stage 200 (or a bonding module 200). The robotic arm 150 then places the two substrates 110, 120 in a plasma stage 170 (or a plasma module 170) for treating the surfaces of the two substrates 110, 120 with plasma. In the plasma stage 170, the plasma activation forms a dangling bond (e.g., silicon dangling bond in the substrate surface).

After the plasma treatment is completed, the robotic arm 150 transfers the two substrates 110, 120 to a cleaning stage 180 (or a cleaning module 180) to clean the surfaces of the substrates. Fluids are used for cleaning the substrates 110, 120 and the examples of fluids will be provided later on (see descriptions related to FIGS. 2, 4A, 4B, and 4C). Once the cleaning process is done, the robotic arm 150 transfers the two substrates 110, 120 to a temperature controlling stage 190 (or temperature controlling module 190) for controlling or maintaining temperature of the two substrates 110, 120. The temperature controlling module is configured to adjust a first temperature for the bottom substrate 110 and a second temperature for the top substrate 120. The temperature controlling module includes a conduit for transporting a temperature controlling fluid. In some cases, fluid may be utilized to cool down the temperature of substrate. The temperatures of the two substrates 110, 120 are controlled so that both substrates are maintained at a substantially identical temperature. After the temperature controlling process is completed, the robotic arm 150 transfers the two substrates 110, 120 to a bonding stage 200 for bonding the two substrates 110, 120. The top substrate 120 is flipped within the bonding stage 200 and bonded on top of the bottom substrate 110. For example, in the bonding module that includes a top chuck and a bottom chuck, the top chuck holds on to the top substrate 120 and the bottom chuck holds on to the bottom substrate 110 (e.g., using vacuum). In this process, the bottom substrate 110 and the top substrate 120 are aligned so that the bonding process considers the crystal direction of the molecules in the substrates 110, 120. A camera can be used to see the patterns on both substrates to ensure accurate alignment between the bottom substrate 110 and the top substrate 120 (e.g., no displacement between the bottom substrate 110 and the top substrate 120). When the substrate bonding process is completed, the robotic arm 150 transfers the bonded substrate 125 and places the substrate 125 backing into the first load port 130.

In some embodiments, each of the stages may be implemented by using a separate chamber. For example, the aligning stage 160 may be implemented with an aligning chamber and the plasma stage 170 may be implemented with a plasma chamber, and so forth. However, in other embodiments, each stage does not have to be necessarily performed within a chamber. For example, the temperature controlling stage 190 may not necessarily be implemented as a temperature controlling chamber as long as the temperature controlling function is performed before the substrates are delivered to the bonding stage 200.

In the bonding stage 200, before the bonding is performed alignment between the substrates are conducted in order not to create pattern deformation or distortion. When the bonding occurs, a bonding pin presses the top substrate 120 against the bottom substrate 110 to bond the substrates to each other. In the bonding process, various substrate bonding schemes may be employed including, but not limited to, oxide fusion bond, hybrid fusion bond, and so forth. In some embodiments, the bottom substrate 110 may be a structure substrate having an oxide layer on the top. For example, on a silicon substrate, a structure layer is formed on the silicon substrate, and an oxide layer is formed on the structure layer. Front-end-of-line (FEOL) processing, middle-end-of-line (MEOL) processing, and back-end-of-line (BEOL) processing are applied in the structure layer. FEOL refers to the construction of the components of the IC (integrated circuit) directly inside the substrate. The BEOL processing step is performed to deposit the metal wiring between the individual devices in order to interconnect them, with a process called metallization. That is, the BEOL is the second portion of IC fabrication where the individual devices (transistors, capacitors, resistors, etc.) are interconnected with wiring on the substrate, the metallization layer. In some embodiments, the top substrate 120 may be a blanket substrate having an oxide layer on the top. For example, on a silicon substrate, an oxide layer is formed on the silicon substrate.

Oxide fusion bond is the process of bonding the structure substrate with the blanket substrate. That is, the top oxide layer of the structure substrate is bonded with the top oxide layer of the blanket substrate. Alternatively, the blanket substrate may be bonded with another blanket substrate. That is, if the bottom substrate 110 is a blanket substrate and the top substrate 120 is a blanket substrate, the top oxide layer of the bottom substrate 110 is bonded with the top oxide layer of the top substrate 120.

In some embodiments, the structure substrate may not have an oxide layer formed on the top. For example, on a silicon substrate, a structure layer is formed on the silicon substrate without forming an oxide layer on the structure layer. This type of structure substrate is also bonded with another similar type of structure substrate using a hybrid fusion bond. In this hybrid fusion bond scheme, the structure layer of the bottom substrate 110 may be bonded with the structure layer of the top substrate 120.

In one or more embodiments of the present disclosure, the temperature controlling function is performed at the temperature controlling stage 190 and the bonding stage 200. The temperature controlling scheme within the bonding stage 200 will be explained in detail later on.

Figure 2:
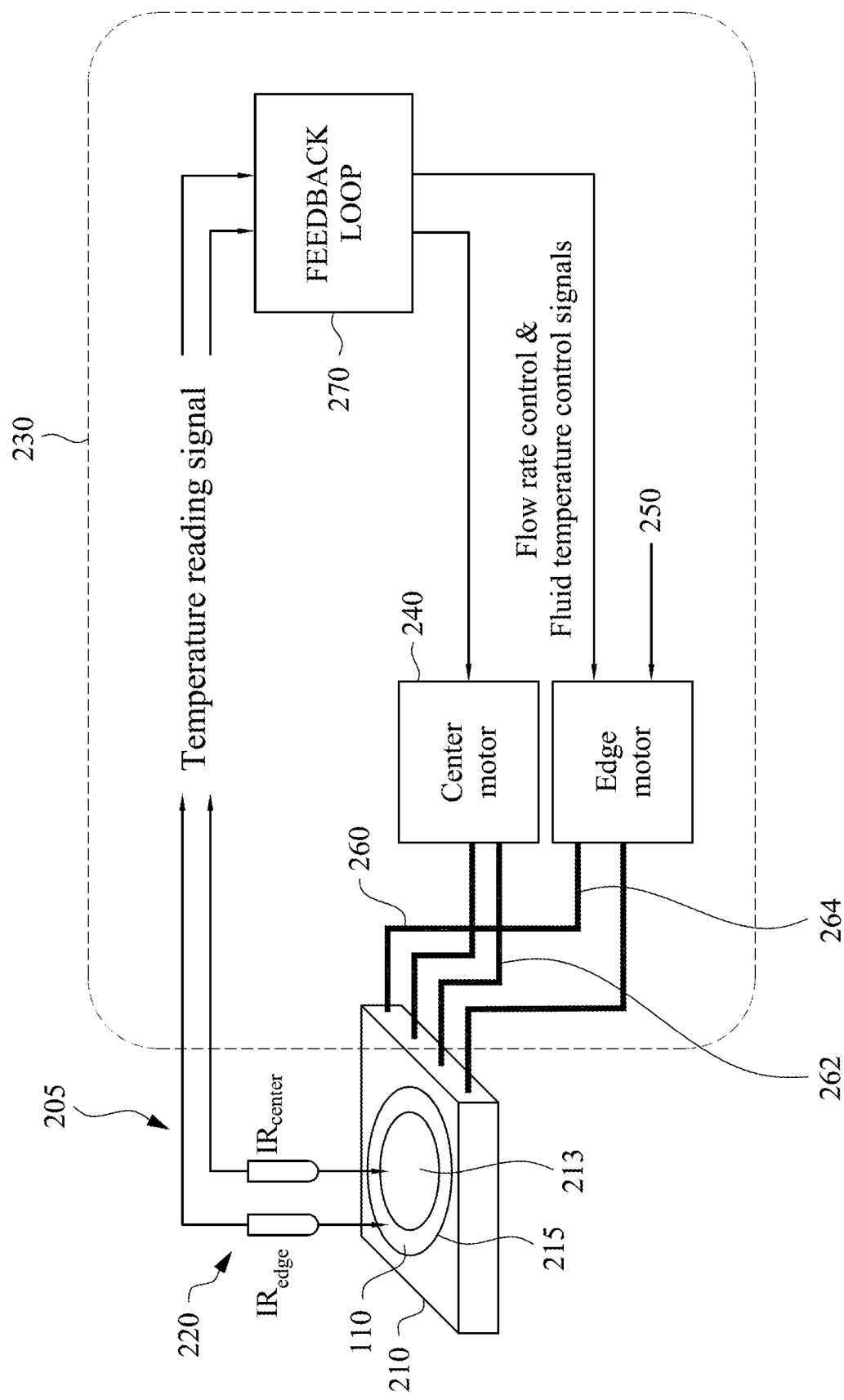
FIG. 2 illustrates a schematic diagram of a temperature controlling apparatus utilized in the temperature controlling stage according to one or more embodiments of the present disclosure.

FIG. 2 illustrates a schematic diagram of a temperature controlling apparatus 205 utilized in the temperature controlling stage 190 according to one or more embodiments of the present disclosure. As shown in FIG. 2, a bottom substrate 110 is placed on substrate temperature controlling plate 210 (or a substrate support 210). The substrate temperature controlling plate 210 has a center temperature control zone 213 and an outer temperature control zone 215 that is adjacent to an outer periphery of the center temperature control zone 213. The center temperature control zone 213 receives temperature controlling fluid from a first zone conduit 262 and the outer temperature control zone 215 receives temperature controlling fluid from a second zone conduit 264. The term "cooling" as used throughout the specification is broadly used for controlling the temperature. Accordingly, the term "cooling" will not necessarily mean bringing a higher temperature to a lower temperature. The substrate temperature controlling plate 210 can be supplied with fluid to control temperature and does not necessarily mean that the substrate placed on the substrate temperature controlling plate 210 will be reduced in temperature. For example, in accordance with some embodiments of the present disclosure, the temperature of a substrate on the temperature controlling plate will be maintained or in other embodiments, may be elevated.

The temperature controlling apparatus 205 includes sensors for detecting the temperature of the substrate 110. Various sensors suitable for detecting the temperature of a substrate may be used and in some embodiments of the present disclosure, infrared ray (IR) sensors or inspectors are used to detect the temperature of the substrate 110. One example of the IR sensors includes an IR pyrometer but other suitable sensors capable of detecting temperature of the substrate may be utilized. FIG. 2 illustrates two zones for detecting temperature of the substrate 110. However, there may be other number of zones that are more than two zones. As illustrated, one IR sensor, $IR_{center}$ is used to detect the temperature of the substrate 110 at the center temperature control zone 213. Another IR sensor, $IR_{edge}$ is used to detect the temperature of the substrate 110 at the outer temperature control zone 215. In other embodiments, for example, in a multi-zone scheme, multiple IR sensors may be utilized to detect the temperature of the substrate 110 in multiple zones. In further embodiments, one or more IR sensors may be utilized to detect the temperature of the substrate at a certain zone to, for example, improve the accuracy of the temperature readings. That is, the present disclosure does not limit one IR sensor for each zone.

In one or more embodiments, temperature control of the substrate 110 using the temperature controlling apparatus 205 can reduce variations in the substrate 110 induced by unequal thermal expansion within the substrate 110. For example, the thermal expansion coefficient of Si is $2.5 \times 10^{-6} K^{-1}$ (at 20° C.). If the substrate/die size is 30 mm×40 mm and if the center temperature control zone 213 exhibits a 1° C. temperature difference from the outer temperature control zone 215, a die formed at the center of the substrate may exhibit a size that is about 75 nm×100 nm different from the size of a die formed near an outer periphery of the substrate where the temperature of the outer periphery of the substrate is different from the temperature of the center of the substrate. This difference in size and potentially other properties of the die (for example, mechanical property or the like) may worsen bonding distortion and create overlay residuals.

Some embodiments in accordance with the current disclosure address the foregoing problem by reducing temperature variation within the substrate 110 (e.g., maintains temperature uniformity throughout the substrate) by using the temperature controlling apparatus 205. Temperature control achieved in accordance with embodiments described herein can improve bond wave propagation control in substrates to achieve an isotropic Young's Modulus and Shear modulus in different crystal directions. For example, an isotropic Young's Modulus and Shear modulus in the (100) plane of the silicon surface can be achieved based on the temperature controlling scheme according to one or more embodiments of the present disclosure.

Referring back to FIG. 2, to control temperature variation within the substrate 110, a fluid cooling system 230 is employed. The fluid cooling system 230 can be a part of the temperature controlling apparatus 205 or can be operatively connected to the temperature controlling apparatus 205. In one or more embodiments, the fluid cooling system 230 includes a first zone fluid moving device 240 (or in one embodiment, a center motor 240) and a second zone fluid moving device 250 (or in one embodiment, an edge motor 250) for controlling fluids 260 that come in and out of the substrate temperature controlling plate 210. The fluids are transferred through one or more conduits that are coupled to chucks (e.g., a top chuck and a bottom chuck) in a bonding module. In a temperature controlling module, the one or more conduits are coupled to a substrate support which is a structure that a substrate is mounted on. The center motor 240 controls the temperature of the center temperature control zone 213 through the fluid 260 transferred using a first zone conduit 262. As shown in FIG. 2, the first zone conduit 262 is coupled to the substrate temperature controlling plate 210 and the center motor 240. The edge motor 250 controls the temperature of the outer temperature control zone 215 through the fluid 260 transferred using a second zone conduit 264. The second zone conduit 264 is coupled to the substrate temperature controlling plate 210 and the edge motor 250.

Here, IR inspectors (or IR sensors) 220, $IR_{center}$ and $IR_{edge}$, detect the temperature reading for the center temperature control zone 213 and the outer temperature control zone 215, respectively. The temperature reading signals from each $IR_{center}$ and $IR_{edge}$ (e.g., a first zone temperature signal and a second zone temperature signal) are transferred to a feedback circuitry 270 or a feedback loop circuit 270 (or a feedback loop system for a closed loop control mechanism). The feedback loop circuit 270 receives a first zone temperature signal from $IR_{center}$ (e.g., a first sensor) and receive a second zone temperature signal from $IR_{edge}$ (e.g., a second sensor). The feedback loop circuit 270 controls flow of the temperature controlling fluid in the first zone conduit 262 and the second zone conduit 264 by outputting a flow rate control signal to the first zone fluid moving device 240 and the second zone fluid moving device 250. The feedback loop circuit 270 outputs a fluid temperature control signal configured to control a temperature of the temperature controlling fluids in the first zone conduit 262 and the second zone conduit 264 based on the first zone temperature signal and the second zone temperature signal.

That is, in one or more embodiments, the feedback loop circuit 270 receives temperature readings from the IR sensors 220, flow speed of the fluid supplied from the center motor 240 and the edge motor 250, the rate that the temperature of each zone is changing from the IR sensors 220, and the like. After the temperature reading results, as well as other readings from the IR sensors 220, are sent to the feedback loop circuit 270, the feedback loop circuit 270 sends a controlling signal, such as fluid flow rate control signal, configured to control the fluid flow rate of the fluid 260 provided from the motors 240, 250 and sends a fluid temperature control signal configured to control the temperature of the fluid 260 provided from the motors 240, 250. In one embodiment, the temperature of the substrate is targeted to maintain at room temperature. For example, the temperature of the substrate may be set to about 23° C. However, in other embodiments, the temperature of the substrate may be set to a different temperature that is more suitable for bonding the two substrates 110, 120 together.

For example, if the center zone 213 has a higher temperature than the outer zone 215, for the zone with a higher temperature, the feedback loop circuit 270 will control so that the flow rate of the cooling fluid will increase which will in turn cool down the center zone 213 having the higher temperature. Additionally or alternatively, the temperature of the cooling fluid may be controlled to decrease the temperature of the zone with higher temperature. For the zone with a lower temperature, the feedback loop circuit 270 may perform the opposite operation as explained above. One or more embodiments of the present disclosure utilizes the substrate temperature controlling plate 210 to ensure that the top substrate 120 and the bottom substrate 110 have substantially the same temperature before transfer to the bonding stage 200.

In some cases where the temperature of the top substrate 120 and the bottom substrate 110 are substantially identical to each other, the supply of the fluid may stop to maintain that there are no temperature difference between the top substrate 120 and the bottom substrate 110. In other cases, when the temperature of the top substrate 120 and the bottom substrate 110 are substantially identical to each other, the temperature of the fluid that is being supplied may remain at the same level to help maintain substantially identical temperature for both top and bottom substrates. In further cases, when the temperature of the top substrate 120 and the bottom substrate 110 are substantially identical to each other, the temperature of the fluid that is being supplied may remain at the same level and continue to flow without stopping to maintain substantially identical temperature for both top and bottom substrates. It will be apparent to a person of ordinary skill in the art that various fluid controlling schemes as well as fluid temperature controlling schemes may be utilized alone or in combination based on the description provided herein.

In one or more embodiments, the temperature controlling scheme of the substrate temperature controlling plate 210 not only maintains temperature uniformity within a substrate (e.g., either the bottom substrate 110 or the top substrate 120) but also ensures that the temperature difference between the bottom substrate 110 and the top substrate 120 is minimal so that both substrates 110, 120 have substantially the same temperature.

The bonding module includes similar components and similar configurations as those shown in FIG. 2 utilized in the temperature controlling module. For example, the top chuck of the bonding module includes a top chuck conduit for transporting a temperature controlling fluid within the top chuck and the bottom chuck includes a bottom chuck conduit for transporting a temperature controlling fluid within the bottom chuck.

A top chuck fluid moving device (e.g., similar to that of the motor providing fluid in a temperature controlling module) is in fluid communication with the top chuck conduit. Further, a bottom chuck fluid moving device is in fluid communication with the bottom chuck conduit.

The bonding module includes a feedback circuitry operationally coupled to a first sensor (e.g., IR sensor positioned in a center of a substrate), a second sensor (e.g., IR sensor positioned at an edge of a substrate), the top chuck fluid moving device, and the bottom chuck fluid moving device. The first sensor is configured to sense a first temperature reading signal based on a temperature of the first substrate in the first zone (e.g., central zone of the substrate), and the second sensor is configured to sense a second temperature reading signal based on a temperature of the first substrate in the second zone (e.g., an outer zone of the substrate).

The feedback circuitry is configured to receive temperature reading signals from the first zone and the second zone of the first substrate. The temperature reading signals include a first temperature reading signal and a second temperature reading signal.

The feedback circuitry is configured to output a flow rate control signal configured to control a flow rate of the temperature controlling fluids in the top chuck fluid moving device and the bottom chuck fluid moving device based on the temperature reading signals, and output a fluid temperature control signal configured to control a temperature of the temperature controlling fluids in the top chuck fluid moving device and the bottom chuck fluid moving device based on the temperature reading signals.

Figure 3B:
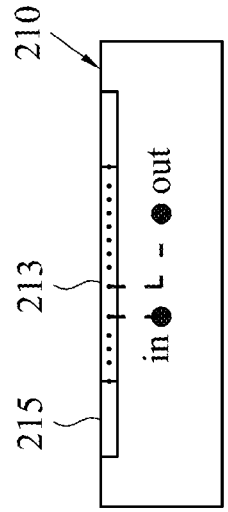
FIG. 3B is a cross-sectional view of the substrate temperature controlling plate taken along line B-B' of FIG. 3A.
Figure 3C:
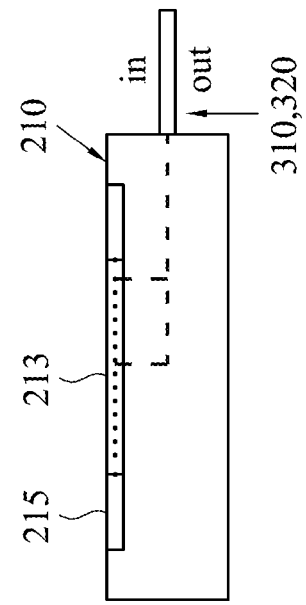
FIG. 3C is a cross-sectional view of the substrate temperature controlling plate taken along line C-C' of FIG. 3A.
Figure 3A:
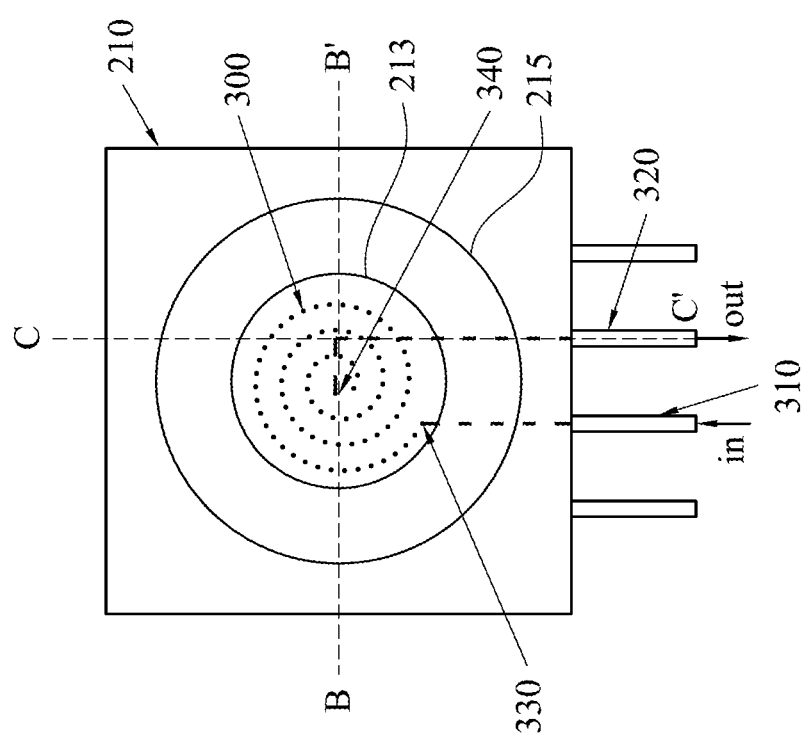
FIG. 3A is a top plan view of a center zone of a substrate temperature controlling plate.

FIGS. 3A, 3B, and 3C are a fluid cooling configuration for a center zone of a substrate temperature controlling plate according to one embodiment of the present disclosure. FIG. 3A is a top plan view of a center zone of a substrate temperature controlling plate. FIG. 3B is a cross-sectional view of the substrate temperature controlling plate taken along line B-B' of FIG. 3A. FIG. 3C is a cross-sectional view of the substrate temperature controlling plate taken along line C-C' of FIG. 3A. In some embodiments, the configuration described herein in connection with FIGS. 3A, 3B, and 3C can also be applied to the configurations of the top chuck as well as the bottom chuck. However, in other embodiments, the configuration described herein in connection with FIGS. 3A, 3B, and 3C can be applied to the configurations of one of the chucks between the top chuck and the bottom chuck. The other chuck may have different temperature controlling mechanisms based on different arrangements of the temperature sensor and fluid controlling mechanisms. This variation can be similarly applied to the further embodiments described in FIGS. 4 through 7.

In FIG. 3A, an inward fluid pipe 310 and an outward fluid pipe 320 are coupled to the substrate temperature controlling plate 210. When the fluid 260 is provided into the center zone 213, the fluid 260 may be provided along a spiral-like path 300 in the center zone 213. As shown, the inward fluid pipe 310 provides the fluid 260 from the most outer spiral point 330 of the spiral path 300 and after the fluid 260 circulates within the center zone 213, the fluid 260 exits through the outward fluid pipe 320 connected at the center point 340 (or some point near the center) of the substrate temperature controlling plate 210. This spiral path configuration is merely utilized as an example and other suitable path configuration, e.g., serpentine or rectangular, may be utilized to effectively control and maintain the temperature of the substrate placed on the substrate temperature controlling plate 210. Further, the direction of the fluid 260 does not necessarily have to enter from the most outer region and exit from the center region. That is, the direction of the fluid 260 may be provided from the center region and exit at the most outer region after circulation. The opposite flow direction of the fluid 260 does not necessarily impact the temperature control efficiency and a person of ordinary skill in the art would readily contemplate other variations and configurations.

The fluid 260 utilized to control the temperature may include de-ionized water (DIW). Further examples of the fluid 260 include 95% DIW with propylene glycol and 95% DIW with ethylene glycol. In addition, antioxidants or glycerol may be added to the above examples. That is, DIW with addition of antioxidants or glycerol, 95% DIW with propylene glycol further with the addition of antioxidants or glycerol, and 95% DIW with ethylene glycol further with the addition of antioxidants or glycerol may be used as the fluid 260 provided to the substrate temperature controlling plate 210.

In some embodiments, based on the temperature reading signal received from the IR sensors 220, the feedback loop circuit 270 may control the fluid flow speed by providing the center motor 240 (and the edge motor 250 in case the outer zone 215 is being controlled) with the flow rate control signal. For example, the fluid flow speed may vary in the range from about 15 L/min (liter/minute) to about 50 L/min based on the flow rate control signal.

The feedback loop circuit 270 controls the motors 240, 250 to tune the temperature of substrate temperature controlling plate 210 from about 15° C. to about 65° C. which is the range of the bonding temperature (that is, the substrate temperature controlling plate 210 has the capability to set the temperature within this range). In some cases, temperature may vary about ±0.5° C. from the bonding temperature set point (e.g., about 15° C. to about 65° C.).

Although not shown, a top substrate 120 may be placed on a similar substrate temperature controlling plate 210. A vacuum is used to hold the top substrate 120 and the bottom substrate 110 to the substrate temperature controlling plate 210 during the temperature controlling stage 190.

Figure 4B:
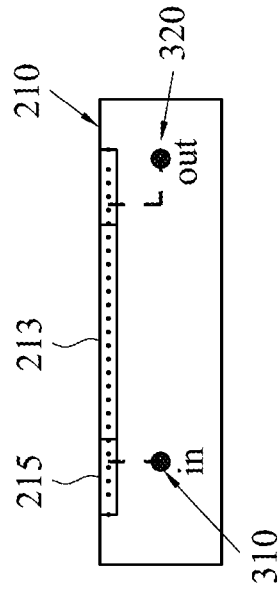
FIG. 4B is a cross-sectional view of the substrate temperature controlling plate taken along line D-D' of FIG. 4A.
Figure 4C:
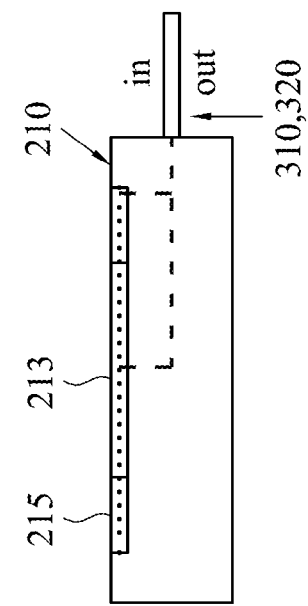
FIG. 4C is a cross-sectional view of the substrate temperature controlling plate taken along line E-E' of FIG. 4A.
Figure 4A:
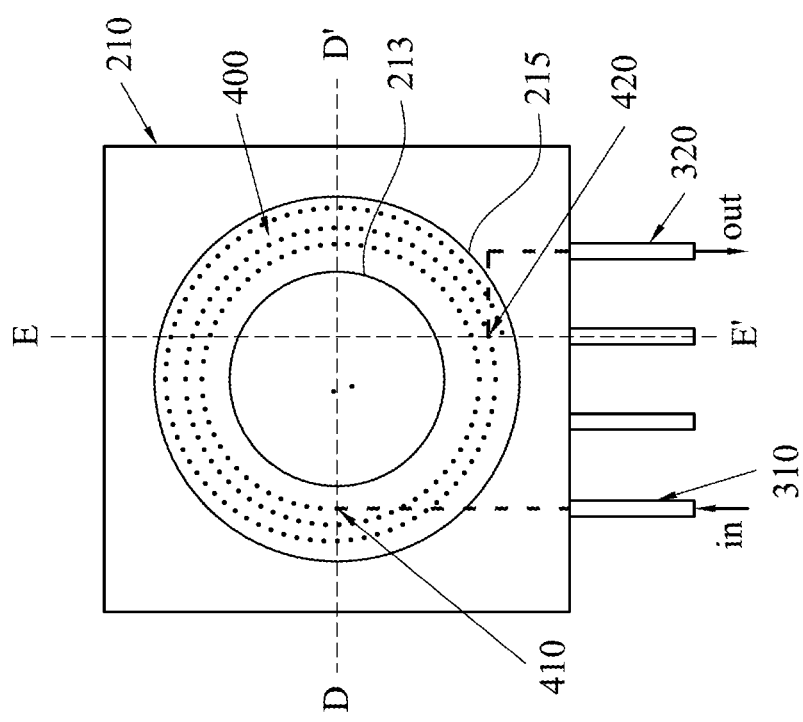
FIG. 4A is a top plan view of the outer zone of a substrate temperature controlling plate.

FIGS. 4A, 4B, and 4C are a fluid cooling configuration for an outer zone of a substrate temperature controlling plate according to one embodiment of the present disclosure. FIG. 4A is a top plan view of the outer zone of a substrate temperature controlling plate. FIG. 4B is a cross-sectional view of the substrate temperature controlling plate taken along line D-D' of FIG. 4A. FIG. 4C is a cross-sectional view of the substrate temperature controlling plate taken along line E-E' of FIG. 4A. In one or more embodiments, the configuration described herein in connection with FIGS. 4A, 4B, and 4C can also be applied to the configurations of the top chuck as well as the bottom chuck.

In FIG. 4A, when the fluid 260 is provided into the outer zone 215, the fluid 260 may be provided along a spiral-like path 400 at the outer zone 215. As shown, the inward fluid pipe 310 provides the fluid 260 from the most inner spiral point 410 and after the fluid 260 circulates within the outer zone 215, the fluid 260 exits through the outward fluid pipe 320 connected at the most outer spiral point 420 of the substrate temperature controlling plate 210. The direction of the fluid 260 does not necessarily have to enter from the most inner region of the outer zone 215 and exit from the most outer region of the outer zone 215. That is, the direction of the fluid 260 may be provided from the most outer region and exit at the most inner region of the outer zone 215 after circulation. For example, the flowing the fluid 260 in an opposite flow direction than is shown in FIG. 4A would not necessarily impact the temperature control efficiency in the outer zone 215.

Figure 5:
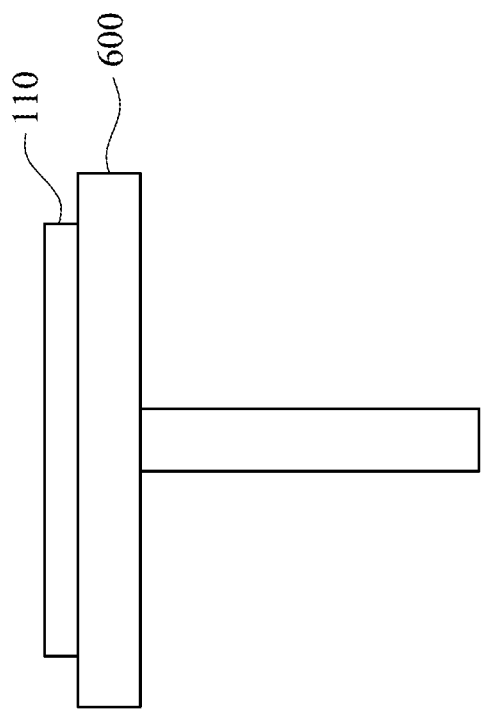
FIG. 5 is a schematic side view of a substrate holder used in a bonding stage for bonding a bottom substrate to a top substrate according to one embodiment of the present disclosure.

FIG. 5 is a schematic side view of a substrate holder used in a bonding stage for bonding a bottom substrate to a top substrate according to one embodiment of the present disclosure. It will be apparent to one of skilled person in the art that the configuration of the substrate holder can be used to hold the bottom substrate and serve as a bottom chuck. In some embodiments, the same configuration of the substrate holder described herein in connection with FIG. 5 can also be used to hold the top substrate and serve as a top chuck.

Referring back to FIG. 1, in accordance with some embodiments, the temperature control is also performed in the bonding stage 200 as well as in the temperature controlling stage 190. In the previous temperature controlling stage 190, the substrate temperature controlling plate 210 ensures that the bottom substrate 110 and the top substrate 120 have substantially the same temperature before being transferred into the bonding stage 200. That is, in addition to avoiding stress caused by the temperature difference between the center zone 213 and the outer zone 215 or a given substrate, it is beneficial for the temperature of both substrates 110, 120 to be of substantially the same temperature or the temperature difference between the two substrates 110, 120 be within an acceptable threshold. For example, the substrate temperature difference may be below 1° C. However, the acceptable threshold for temperature difference is not limited to the aforementioned range.

In this regard, the temperature of the substrates 110, 120 might change in the process of being transferred into the bonding stage 200 or might change during the process of the bonding between the two substrates 110, 120 in the bonding stage 200. Accordingly, a substrate holder 600 (also known as a "chuck"; further as described previously, if it is used to hold a top substrate, it may be referred to as a "top chuck" and if it is used to hold a bottom substrate, it may be referred to as a "bottom chuck") according to the present disclosure provides a temperature controlling function in the substrate holder 600. For example, during bonding process, the substrate holder 600 will control the temperature of the substrate 110 by using fluid 260 (e.g., cooling water) similar to that used in the temperature controlling stage 190. By controlling the temperature of a substrate during the bonding stage 200, the substrate holder 600, according to the present disclosure, avoids the top and bottom substrate having different scaling values and induced distortion.

Figure 6B:
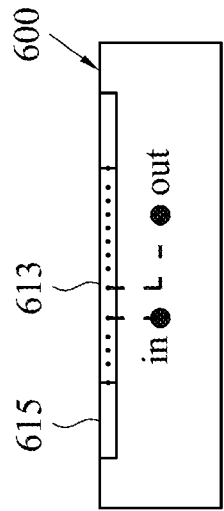
FIG. 6B is a cross-sectional view of the substrate holder taken along line B-B' of FIG. 6A.
Figure 6C:
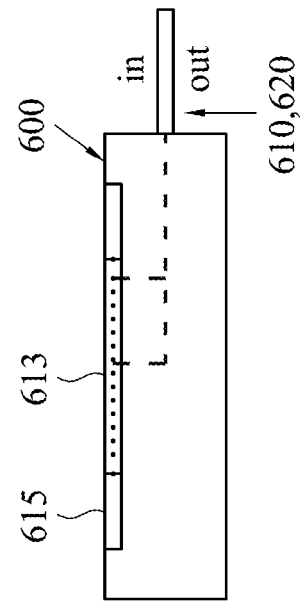
FIG. 6C is a cross-sectional view of the substrate holder taken along line C-C' of FIG. 6A.
Figure 6A:
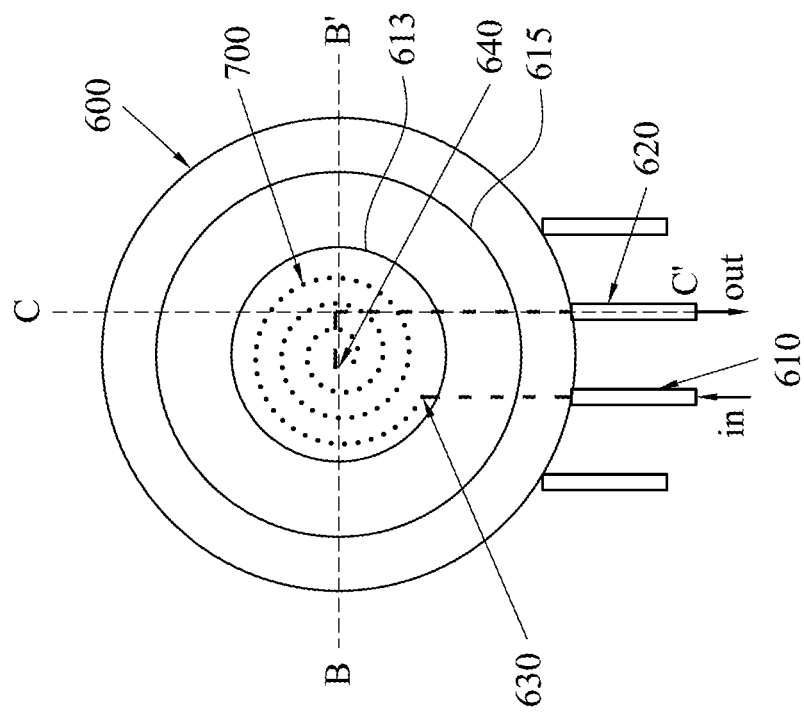
FIG. 6A is a top plan view of a center zone of the substrate holder.

FIGS. 6A, 6B, and 6C are a fluid cooling configuration for a center zone of a substrate holder (or a chuck) in a substrate bonding apparatus according to one embodiment of the present disclosure. FIG. 6A is a top plan view of a center zone of the substrate holder. FIG. 6B is a cross-sectional view of the substrate holder taken along line B-B' of FIG. 6A. FIG. 6C is a cross-sectional view of the substrate holder taken along line C-C' of FIG. 6A. In one or more embodiments, the substrate temperature controlling plate 210 and the substrate holder 600 may have substantially similar configuration for utilizing fluid flow to control temperature of the substrates. In some embodiments, the configuration described herein in connection with FIGS. 6A, 6B, and 6C can also be applied to the configurations of the top chuck as well as the bottom chuck.

In FIG. 6A, an inward fluid pipe 610 (or a first chuck conduit) and an outward fluid pipe 620 (or a second chuck conduit) are coupled to the substrate holder 600. When the fluid 260 is provided into the center zone 613, the fluid 260 may be provided along a spiral-like path 700 in the center zone 613. As shown, the inward fluid pipe 610 provides the fluid 260 from the most outer spiral point 630 of the spiral path 700 and after the fluid 260 circulates within the center zone 613, the fluid 260 exits through the outward fluid pipe 620 connected at the center point 640 (or some point near the center) of the substrate holder 600. This spiral path configuration is merely utilized as an example and other suitable path configuration may be utilized to effectively control and maintain the temperature of the substrate placed on the substrate holder 600. Further, the direction of the fluid 260 does not necessarily have to enter from the most outer region and exit from the center region. That is, the direction of the fluid 260 may be provided from the center region and exit at the most outer region after circulation. The opposite flow direction of the fluid 260 does not necessarily impact the temperature control efficiency and a person of ordinary skill in the art would readily contemplate other variations and configurations.

The fluid 260 utilized to control the temperature is substantially similar to those used in connection with the substrate temperature controlling plate 210.

Further, the substrate holder 600 may have substantially the same configuration of the feedback loop circuit for controlling temperature as described in connection with FIG. 2. Accordingly, the IR sensors 220 and the center, edge motors 240, 250 may be utilized in implementing the substrate holder 600 according to the present disclosure. To avoid redundant explanation, FIG. 2 will be referred to for reference.

In the bonding stage 200, based on the temperature reading signal received from the IR sensors 220, the feedback loop circuit 270 may control the fluid flow speed by providing the center motor 240 (and the edge motor 250 in case the outer zone 615 is being controlled) with the flow rate control signal. For example, the fluid flow speed may vary in the range from about 15 L/min (liter/minute) to about 30 L/min based on the flow rate control signal. The maximum fluid flow speed in the bonding stage 200 is substantially lower than that of the fluid speed in the substrate temperature controlling plate 210 of the temperature controlling stage 190. During the bonding of the two substrates 110, 120, the substrates are bonded in a way so that the crystal orientation is matched. Accordingly, a fluid speed that is beyond 30 L/min will likely to induce vibration and impede the bonding of the two substrates 110, 120 due to high fluid flow rate.

Although not shown, a top substrate 120 may be placed on a similar substrate holder 600. That is, the top substrate 120 placed on the top chuck or the top substrate holder and the bottom substrate 110 placed on the bottom chuck or the bottom substrate holder will be combined in the bonding stage and a vacuum may be used to hold the top substrate 120 and the bottom substrate 110 to each substrate holder during the bonding stage 200.

Figure 7B:
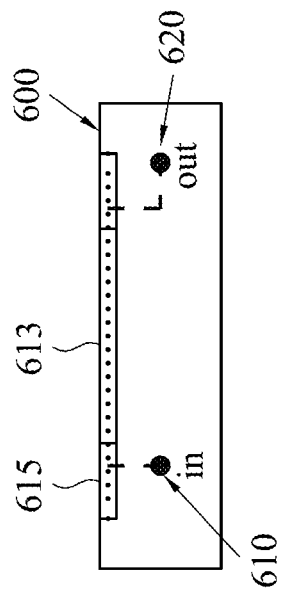
FIG. 7B is a cross-sectional view of the substrate holder taken along line D-D' of FIG. 7A.
Figure 7C:
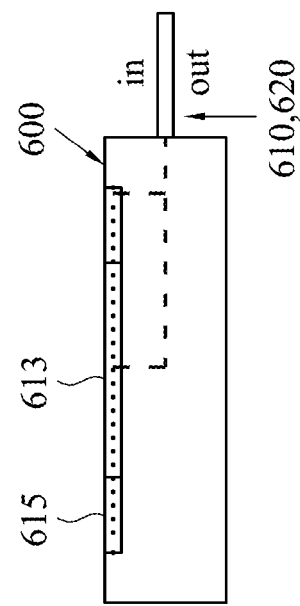
FIG. 7C is a cross-sectional view of the substrate holder taken along line E-E' of FIG. 7A.
Figure 7A:
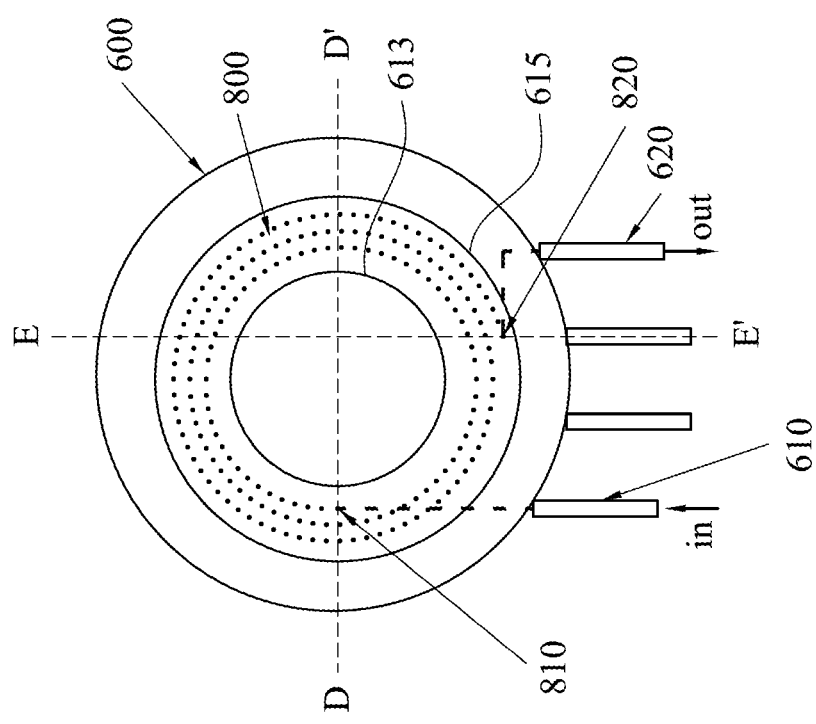
FIG. 7A is a top plan view of the outer zone of the substrate holder.

FIGS. 7A, 7B, and 7C are a fluid cooling configuration for an outer zone of a substrate holder according to one embodiment of the present disclosure. FIG. 7A is a top plan view of the outer zone of the substrate holder. FIG. 7B is a cross-sectional view of the substrate holder taken along line D-D' of FIG. 7A. FIG. 7C is a cross-sectional view of the substrate holder taken along line E-E' of FIG. 7A. In some embodiments, the configuration described herein in connection with FIGS. 7A, 7B, and 7C can also be applied to the configurations of the top chuck as well as the bottom chuck.

In FIG. 7A, when the fluid 260 is provided into the outer zone 615, the fluid 260 may be provided along a spiral-like path 800 at the outer zone 615. As shown, the inward fluid pipe 610 provides the fluid 260 from the most inner spiral point 810 and after the fluid 260 circulates within the outer zone 615, the fluid 260 exits through the outward fluid pipe 620 connected at the most outer spiral point 820 of the substrate holder 600. The direction of the fluid 260 does not necessarily have to enter from the most inner region of the outer zone 615 and exit from the most outer region of the outer zone 615. That is, the direction of the fluid 260 may be provided from the most outer region and exit at the most inner region of the outer zone 615 after circulation. For example, the flowing the fluid 260 in an opposite flow direction than is shown in FIG. 7A would not necessarily impact the temperature control efficiency in the outer zone 615.

Some embodiments in accordance with the present disclosure provide a unique tool designed to actively control the substrate environment at different stage of a substrate bonding process (e.g., the temperature controlling stage 190 and the bonding stage 200). The present disclosure provides a substrate bonding apparatus capable of temperature monitoring and temperature control. In the temperature controlling stage 190 of the substrate bonding apparatus, substrate temperature controlling plate 210 is utilized to monitor and control the temperature of the substrates being processed. In the bonding stage 200 of the substrate bonding apparatus, substrate holder 600 is utilized to monitor and control the temperature of the substrates being processed. Both the substrate temperature controlling plate 210 and the substrate holder 600 includes a fluid controlling module, and a sensor module for detecting temperatures at multiple zones (e.g., 2 or more zones) within a substrate. The substrate bonding apparatus according to the present disclosure achieves temperature stabilization within the substrate. The substrate bonding apparatus further improves bonding process performance by reducing distortion residual, reducing bubbles on edges of the substrate, and reducing non-bonded area within the substrate. Further technical benefit of the substrate bonding apparatus is to reduce overlay residuals.

In some embodiments, there are multiple zones on the substrate in the temperature controlled stages. The set points of each zone can be set differently to ensure the temperature uniformity measured on substrate. By doing so, the embodiments of the present disclosure improve the bonding distortion during substrate fusion bonding, prevent bubble defect in substrate fusion bonding, and improve run-to-run stability in substrate fusion bonding by controlling the substrate temperature in the fusion bonder. The technical benefits of the present disclosure are not limited to those listed above and a person of ordinary skill in the art would readily appreciate further technical benefits based on the detailed description provided herein.

The technology areas where the embodiments of the present disclosure may be applied include substrate fusion bonding, oxide-to-oxide bonding, hybrid bonding, hydrophilic bonding, and hydrophobic bonding. However, these are not limiting examples and other applicable technology fields would be readily appreciated by a person of ordinary skill in the art.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A substrate processing apparatus, comprising:
a plasma module configured to apply plasma to a first substrate and a second substrate;
a cleaning module configured to clean one or more surfaces of the first substrate and the second substrate;
a temperature controlling module configured to adjust a first temperature for the first substrate and a second temperature for the second substrate, the temperature controlling module including at least one a conduit for transporting a temperature controlling fluid, the temperature controlling module including a first sensor configured to detect a temperature of a first zone of the first substrate, and a second sensor configured to detect a temperature of a second zone of the first substrate; and
a bonding module configured to bond the first substrate to the second substrate, the bonding module including a top chuck and a bottom chuck, wherein the top chuck includes a top chuck conduit for transporting a temperature controlling fluid within the top chuck and the bottom chuck includes a bottom chuck conduit for transporting a temperature controlling fluid within the bottom chuck.

2. The substrate processing apparatus of claim 1, wherein the first zone is located at an inner part of the first substrate, and the second zone is located at an outer part of the first substrate, and
wherein the first zone is adjacent to and in contact with the second zone.

3. The substrate processing apparatus of claim 2, wherein the temperature controlling module further comprises:
a substrate support, the substrate support including a first zone conduit for transporting a temperature controlling fluid to the first zone and a second zone conduit for transporting a temperature controlling fluid to the second zone;
a first zone fluid moving device in fluid communication with the first zone conduit; and
a second zone fluid moving device in fluid communication with the second zone conduit.

4. The substrate processing apparatus of claim 3, wherein the temperature controlling module further comprises:
a feedback circuitry operationally coupled to the first sensor, the second sensor, the first zone fluid moving device, and the second zone fluid moving device, wherein the feedback circuitry is configured, in operation, to:
receive a first zone temperature signal from the first sensor and receive a second zone temperature signal from the second sensor; and
control flow of the temperature controlling fluid in at least one of the first zone conduit and the second zone conduit by outputting a flow rate control signal to at least one of the first zone fluid moving device and the second zone fluid moving device.

5. The substrate processing apparatus of claim 4, wherein the feedback circuitry is further configured to:
output a fluid temperature control signal configured to control a temperature of the temperature controlling fluids in at least one of the first zone conduit and the second zone conduit based on at least one of the first zone temperature signal and the second zone temperature signal.

6. The substrate processing apparatus of claim 2, wherein the bonding module further comprises:
a top chuck fluid moving device in fluid communication with the top chuck conduit;
a bottom chuck fluid moving device in fluid communication with the bottom chuck conduit; and
a feedback circuitry operationally coupled to the first sensor, the second sensor, the top chuck fluid moving device, and the bottom chuck fluid moving device, wherein the feedback circuitry is configured to:
receive temperature reading signals from the first zone and the second zone of the first substrate, wherein the temperature reading signals include a first temperature reading signal and a second temperature reading signal;
output a flow rate control signal configured to control a flow rate of the temperature controlling fluids in at least one of the top chuck fluid moving device and the bottom chuck fluid moving device based on the temperature reading signals; and
output a fluid temperature control signal configured to control a temperature of the temperature controlling fluids in at least one of the top chuck fluid moving device and the bottom chuck fluid moving device based on the temperature reading signals.

7. A substrate bonding apparatus, comprising:
a top chuck configured to hold a first substrate;
a bottom chuck configured to hold a second substrate;
a top chuck conduit included in the top chuck for transporting a temperature controlling fluid within the top chuck, the top chuck conduit including a first zone conduit and a second zone conduit, and the first zone conduit not being in fluid communication with the second zone conduit; and
a bottom chuck conduit included in the bottom chuck for transporting a temperature controlling fluid within the bottom chuck, the bottom chuck conduit including a third zone conduit and a fourth zone conduit, and the third zone conduit not being in fluid communication with the fourth zone conduit.

8. The substrate bonding apparatus of claim 7, wherein the bonding apparatus further comprises:
a first sensor to detect a temperature of a first zone of the first substrate, and a second sensor to detect a temperature of a second zone of the first substrate,
wherein the first zone is surrounded by the second zone.

9. The substrate bonding apparatus of claim 8, wherein the bonding apparatus further comprises:
a third sensor to detect a temperature of a third zone of the second substrate, and a fourth sensor to detect a temperature of a fourth zone of the second substrate.

10. The substrate bonding apparatus of claim 7, wherein the bonding apparatus further comprises:
a first zone fluid moving device in fluid communication with the first zone conduit;
a second zone fluid moving device in fluid communication with the second zone conduit;
a third zone fluid moving device in fluid communication with the third zone conduit; and
a fourth zone fluid moving device in fluid communication with the fourth zone conduit.

11. The substrate bonding apparatus of claim 10, wherein the bonding apparatus further comprises:
a feedback circuitry operationally coupled to the first to fourth sensors, the first to fourth zone fluid moving devices, wherein the feedback circuitry is configured, in operation, to:
receive a first zone temperature signal from the first sensor;
receive a second zone temperature signal from the second sensor;
receive a third zone temperature signal from the third sensor;
receive a fourth zone temperature signal from the fourth sensor;
control flow of the temperature controlling fluid in at least one of the first zone conduit and the second zone conduit by outputting a flow rate control signal to at least one of the first zone fluid moving device and the second zone fluid moving device based on at least one of the first zone temperature signal and the second zone temperature signal; and
control flow of the temperature controlling fluid in at least one of the third zone conduit and the fourth zone conduit by outputting a flow rate control signal to at least one of the third zone fluid moving device and the fourth zone fluid moving device based on at least one of the third zone temperature signal and the fourth zone temperature signal.

12. The substrate bonding apparatus of claim 11, wherein the feedback circuitry is further configured to:
output a fluid temperature control signal configured to control a temperature of the temperature controlling fluids in at least one of the first zone conduit and the second zone conduit based on at least one of the first zone temperature signal and the second zone temperature signal; and
output a fluid temperature control signal configured to control a temperature of the temperature controlling fluids in at least one of the third zone conduit and the fourth zone conduit based on at least one of the third zone temperature signal and the fourth zone temperature signal.

13. The substrate bonding apparatus of claim 7, wherein the first zone conduit is enveloped by the second zone conduit, and the third zone conduit is enveloped by the fourth zone conduit.

14. A substrate processing system, comprising:
a plasma module configured to apply plasma to a first substrate and a second substrate;
a cleaning module configured to clean one or more surfaces of the first substrate and the second substrate;
a temperature controlling module configured to adjust a first temperature for the first substrate and the first temperature for the second substrate, the temperature controlling module including a conduit for transporting a temperature controlling fluid;
a bonding module configured to bond the first substrate to the second substrate, the bonding module including a top chuck and a bottom chuck, wherein the top chuck includes a top chuck conduit for transporting a temperature controlling fluid within the top chuck and the bottom chuck includes a bottom chuck conduit for transporting a temperature controlling fluid within the bottom chuck;
a first set of sensors coupled to the temperature controlling module, wherein the first set of sensors are configured to detect a temperature of a first zone of the first substrate and a second zone of the first substrate;
a second set of sensors coupled to the bonding module, wherein the second set of sensors are configured to detect a temperature of a third zone of the second substrate and a fourth zone of the second substrate;
a first fluid moving device coupled to the temperature controlling module;
a second fluid moving device coupled to the bonding module; and
a feedback circuitry operationally coupled to a first set of infrared pyrometers, a second set of infrared pyrometers, the first fluid controlling motor, and the second fluid controlling motor, wherein the feedback circuitry is configured, in operation, to control the first temperatures of the first substrate and the second substrate based on controlling the temperature controlling fluids in the temperature controlling module and the second temperatures of the first substrate and the second substrate based on the temperature controlling fluids in the bonding module.

15. The substrate processing system of claim 14, wherein the temperature controlling module further comprises:
a substrate support, the substrate support including a first zone conduit for transporting a temperature controlling fluid to the first zone and a second zone conduit for transporting a temperature controlling fluid to the second zone; and
wherein the first fluid moving device is in fluid communication with the first zone conduit and the second zone conduit; and
wherein the second fluid moving device is in fluid communication with the top chuck conduit and the bottom chuck conduit.

16. The substrate processing system of claim 15, wherein the feedback circuitry is configured, in operation, to:
receive first zone temperature signals from the first set of sensors and receive second zone temperature signals from the second set of sensors;
control flow of the temperature controlling fluid in at least one of the first zone conduit and the second zone conduit by outputting a flow rate control signal to the first fluid moving device; and
control flow of the temperature controlling fluid in at least one of the top chuck conduit and the bottom chuck conduit by outputting a flow rate control signal to the second fluid moving device.

17. The substrate processing system of claim 15, wherein the feedback circuitry is configured, in operation, to:
receive first zone temperature signals from the first set of sensors, including:
receive temperature reading signals from the first zone and the second zone of the first substrate based on the first set of sensors, wherein the temperature reading signals include a first temperature reading signal and a second temperature reading signal, wherein the first temperature reading signal is based on a temperature of the first zone and the second temperature reading signal is based on a temperature of the second zone; and
output a first flow rate control signal configured to control a flow rate of the temperature controlling fluid in the first fluid moving device based on a difference between the first temperature reading signal and the second temperature reading signal to maintain a same or substantially the same temperature between the first zone and the second zone of the first substrate.

18. The substrate processing system of claim 17, wherein the feedback circuitry is further configured, in operation, to:
output a first fluid temperature control signal configured to control a temperature of the temperature controlling fluid in the first fluid moving device based on the difference between the first temperature reading signal and the second temperature reading signal to maintain a same or substantially the same temperature between the first zone and the second zone of the first substrate.

19. The substrate processing system of claim 15, wherein the feedback circuitry is configured, in operation, to:
receive second zone temperature signals from the second set of sensors, including:
receive temperature reading signals from the third zone and the fourth zone of the second substrate based on the second set of sensors, wherein the temperature reading signals include a third temperature reading signal and a fourth temperature reading signal, wherein the third temperature reading signal is based on a temperature of the third zone and the fourth temperature reading signal is based on a temperature of the fourth zone; and
output a second flow rate control signal configured to control a flow rate of the temperature controlling fluid in the second fluid moving device based on a difference between the third temperature reading signal and the fourth temperature reading signal to maintain a same or substantially the same temperature between the third zone and the fourth zone of the second substrate.

20. The substrate processing system of claim 19, wherein the feedback circuitry is further configured to:
output a second fluid temperature control signal configured to control a temperature of the temperature controlling fluid in the second fluid moving device based on the difference between the third temperature reading signal and the fourth temperature reading signal to maintain a same or substantially the same temperature between the third zone and the fourth zone of the second substrate.

* * * * *